United States Patent [19]

Eshima

[11] Patent Number: 5,093,281
[45] Date of Patent: Mar. 3, 1992

[54] METHOD FOR MANUFACTURING SEMICONDUCTOR DEVICES

[75] Inventor: Taizo Eshima, Fukuoka, Japan

[73] Assignee: Mitsubishi Denki Kabushiki Kaisha, Japan

[21] Appl. No.: 333,963

[22] Filed: Apr. 6, 1989

[30] Foreign Application Priority Data

Jul. 13, 1988 [JP] Japan ................. 63-175526

[51] Int. Cl.⁵ .................. H01L 23/02; B29C 13/00
[52] U.S. Cl. .................. 437/217; 437/207; 437/219; 264/272.17; 361/421; 174/52.2
[58] Field of Search ........... 437/207, 209, 215, 217, 437/219; 29/25.01, 430; 361/408, 421; 174/52.2; 264/272.17

[56] References Cited

U.S. PATENT DOCUMENTS

| | | | |
|---|---|---|---|
| 3,686,541 | 8/1972 | Livezey et al. | 357/68 |
| 3,706,840 | 12/1972 | Moyle et al. | 264/272.17 |
| 3,740,618 | 6/1973 | Vogel | 357/79 |
| 3,793,474 | 2/1974 | Dunn et al. | 437/207 |
| 3,992,617 | 11/1976 | Rice | 357/74 |
| 4,298,883 | 11/1981 | Komatsu et al. | 437/217 |
| 4,326,214 | 4/1982 | Trueblood | 437/215 |
| 4,523,371 | 6/1985 | Wakashima | 437/215 |
| 4,552,267 | 11/1985 | Layher | 437/219 |
| 4,701,999 | 10/1987 | Palmer | 264/272.17 |
| 4,741,787 | 5/1988 | Shimizu et al. | 29/25.01 |

FOREIGN PATENT DOCUMENTS

| | | | |
|---|---|---|---|
| 57-133643 | 8/1982 | Japan | 437/209 |
| 58-89851 | 5/1983 | Japan | |
| 58-121633 | 7/1983 | Japan | 437/209 |
| 59-098538 | 6/1984 | Japan | 437/207 |
| 60-55633 | 3/1985 | Japan | 437/209 |
| 60-077432 | 5/1985 | Japan | 437/207 |
| 60-080256 | 5/1985 | Japan | 437/207 |
| 61-144834 | 7/1986 | Japan | 437/207 |
| 63-287041 | 5/1987 | Japan | |
| 63-81961 | 4/1988 | Japan | 437/209 |
| 2-37728 | 7/1988 | Japan | |

OTHER PUBLICATIONS

Modern Microelectronic Circuit Design, vol. I and II, Fogiel, ed., Research and Education Association, NY, N.Y., 1981, pp. 657–671.

*Primary Examiner*—Olik Chaudhuri
*Assistant Examiner*—Andrew Griffin
*Attorney, Agent, or Firm*—Leydig, Voit & Mayer

[57] ABSTRACT

In a method for manufacturing semiconductor devices, to a case main body are bonded leads each having an inner end on the inner side of a side edge of the case main body and an outer end on the outer side of the side edge. A semiconductor chip is electrically connected to the inner ends of the leads on the case main body. Subsequently, a lid is adhesively bonded to the case main body. Accordingly, it is possible to reduce the total time period required to manufacture each semiconductor device and to enhance the reliability and yield of semiconductor devices.

5 Claims, 4 Drawing Sheets

FIG. I
PRIOR ART

METHOD FOR MANUFACTURING SEMICONDUCTOR DEVICES

BACKGROUND OF THE INVENTION

1. Field of the Invention

The present invention relates to a method for manufacturing semiconductor devices which are assembled with the use of, for example, leadframes.

2. Description of the Related Art

FIG. 1 is a flow chart showing a conventional type of method for manufacturing semiconductor devices, FIG. 2 is a schematic perspective view showing a semiconductor device which is assembled by the conventional manufacturing method, FIGS. 3(a) to 3(f) are schematic views which serve to illustrate the process sequence of the conventional manufacturing method, and FIG. 4 is a schematic view showing the manner in which a semiconductor device manufactured by the conventional manufacturing method is subjected to a performance test.

The conventional method for manufacturing semiconductor devices will now be described with reference to FIGS. 1 to 4.

First, as shown in FIG. 3(a), a plurality of semiconductor chips 2 are formed on a semiconductor wafer 1. Then, a sheet 3 is adhesively bonded to the back of the semiconductor wafer 1, and a dicing apparatus (not shown) is used to form grooves 1a in the side of the semiconductor wafer 1 which is opposite to the sheet 3 for the purpose of separating the wafer 1 into the individual semiconductor chips 2 (FIG. 3(b)). After wafer separation, each of the semiconductor chips 2 is bonded to a leadframe 4 by an adhesive 5 (FIG. 3(c)). In this step, a die-bonding apparatus (not shown) is used to perform registration, adhesion, etc. of each of the semiconductor chips 2 and the leadframe 4. Subsequently, a wire-bonding apparatus (not shown) is used to connect each electrode (not shown) of the semiconductor chip 2 to a corresponding inner lead 4a of the leadframe 4 through a metal wire 6 (FIG. 3(d)). The wire-bonded leadframe 4 is molded with a resin by means of a packaging apparatus (not shown), and the resin is formed into a plastic package 7 (FIG. 3(e)). Then, a plating apparatus (not shown) is used to apply a coat of external solder plating 8 to each outer lead 4b of the leadframe 4 (FIG. 3(f)). In this fashion, a plurality of semiconductor chips 2 mounted on the leadframe 4 are packaged by the respective plastic packages 7, and each of the plastic packages 7 is separated from the leadframe 4. Finally, the outer leads 4b of each plastic package 7 are formed into a predetermined configuration and semiconductor devices of the type shown in FIG. 2 are thus assembled.

Each semiconductor device thus assembled is, as shown in FIG. 4, connected to a testing apparatus 9 through a connecting member 9a and is subjected to a performance test. After completion of the test, the semiconductor device is supplied as a product.

The above-described conventional method for manufacturing semiconductor devices, however, leaves the following problems to be solved. First, the arrangements of the physical distributions between respective process steps are complicated and, since the performance of semiconductor devices depends upon the reliability and quality of the equipment used in each process step, as the number of manufacturing devices are increased, high-reliability semiconductor devices become difficult to obtain. Second, since the number of process step is large, a large number of products in process are present between respective process steps and, in addition, since semiconductor devices must be sequentially manufactured in accordance with the order of the process steps after die bonding, the total time period required to manufacture each semiconductor device becomes longer.

SUMMARY OF THE INVENTION

It is, therefore, an object of the present invention to provide a method for manufacturing semiconductor devices which enables resin cases and lids to be manufactured and leads to be formed into a predetermined configuration before semiconductor chips have been manufactured, thereby making it possible to reduce the total time period required to manufacture each semiconductor device and to enhance the reliability and yield of semiconductor devices.

It is another object of the present invention to provide a method for manufacturing semiconductor devices which enables semiconductor chips to be sealed without the need to cause a sealing resin to flow along the semiconductor chips, thereby making it possible to enhance the reliability of semiconductor devices and simplify a testing step.

To achieve the above objects, in accordance with the present invention, there is provided a method for manufacturing semiconductor devices which comprises the steps of: bonding leads to a case main body, the leads each having an inner end on the inner side of a side edge of the case main body and an outer end on the outer side of the side edge; electrically connecting a semiconductor chip to the inner ends of the leads on the case main body, and adhesively bonding a lid to the case main body.

The above and other objects, features and advantages of the present invention will become apparent from the following description of the preferred embodiments thereof, taken in conjunction with the accompanying drawings.

DESCRIPTION OF THE PREFERRED EMBODIMENTS

Preferred embodiments of a method for manufacturing semiconductor devices in accordance with the present invention will be described below with reference to FIGS. 5 to 7.

Figure 1:
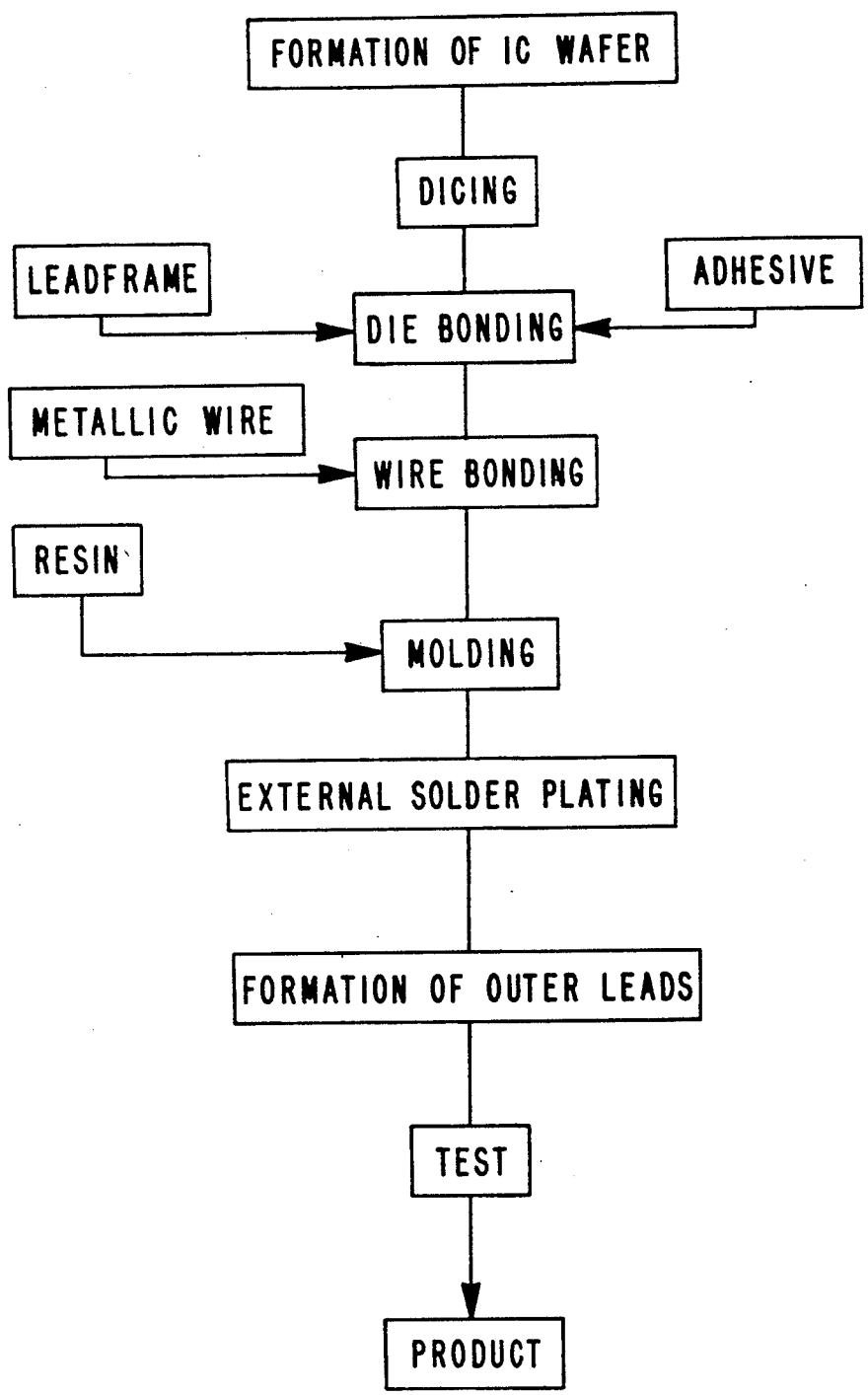
FIG. 1 is a flow chart showing a conventional method for manufacturing semiconductor devices.
Figure 2:
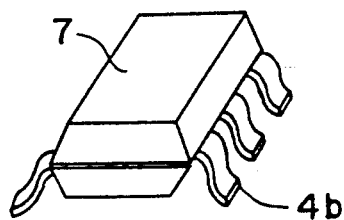
FIG. 2 is a perspective view showing a semiconductor device assembled by the conventional manufacturing method of FIG. 1.
Figure 3A:
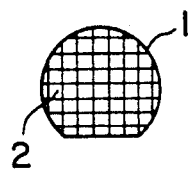
FIGS. 3(a) to 3(f) illustrate the process sequence adopted in the conventional method for manufacturing semiconductor devices.
Figure 3B:
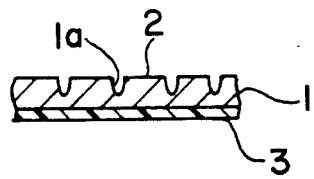
Figure 3C:
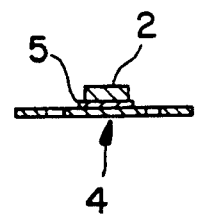
Figure 3D:
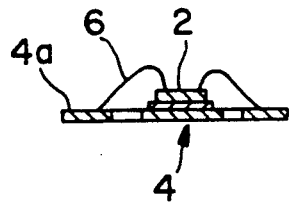
Figure 3E:
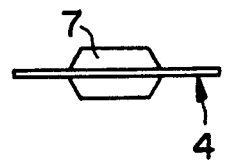
Figure 3F:
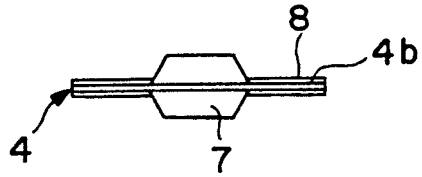
Figure 5:
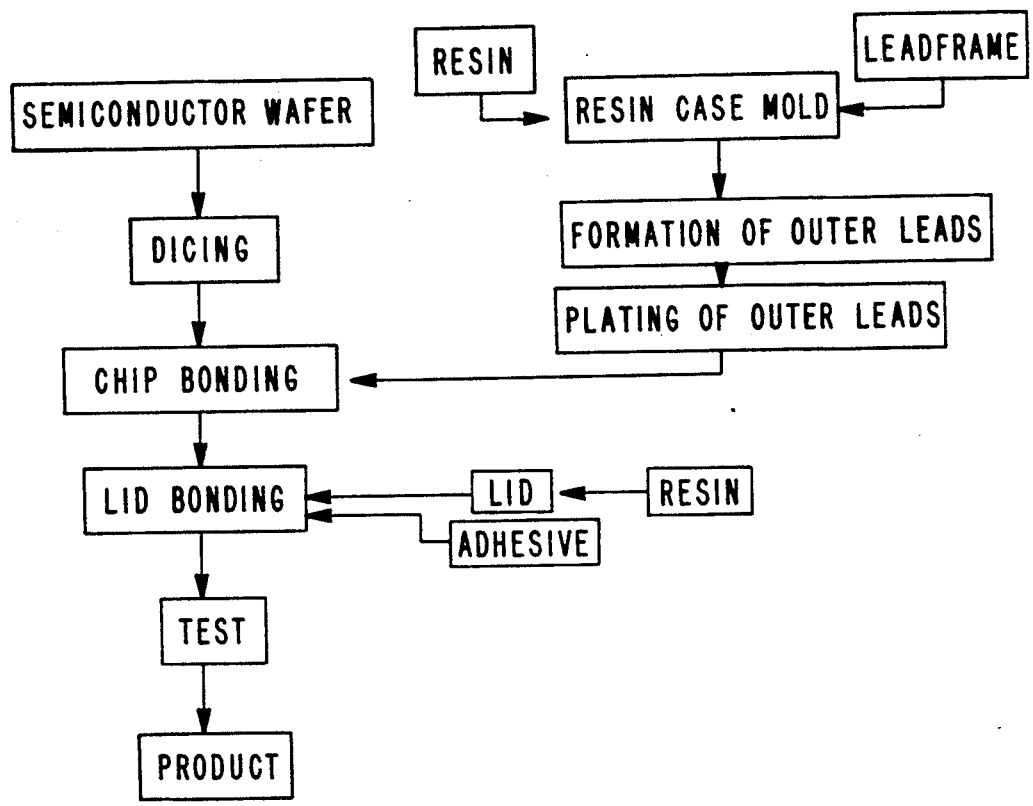
FIG. 5 is a flow chart showing one preferred embodiment of a method for manufacturing semiconductor devices in accordance with the present invention.
Figure 4:
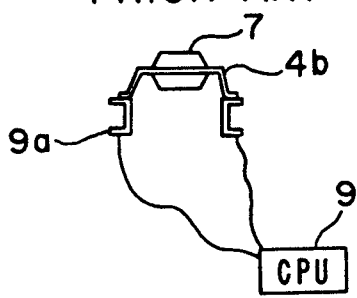
FIG. 4 is a schematic view showing the manner in which a semiconductor device manufactured by the conventional manufacturing method is subjected to a performance test.
Figure 6A:
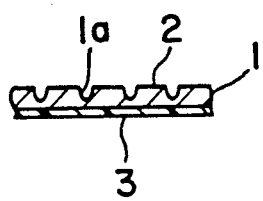
FIGS. 6(a) to 6(i) illustrate the process sequence adopted in the preferred embodiment of a method for manufacturing semiconductor devices in accordance with the present invention.
Figure 6B:
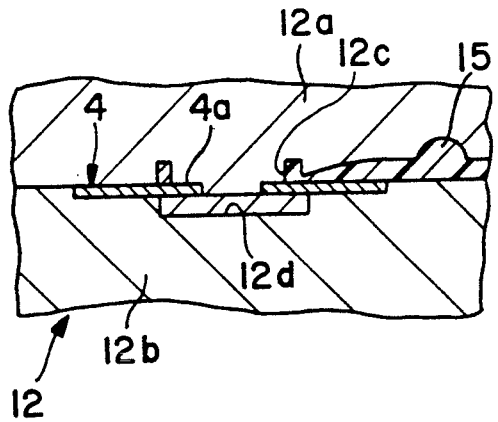
Figure 6C:
Figure 6D:
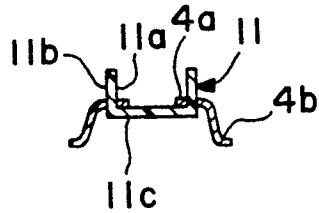
Figure 6E:
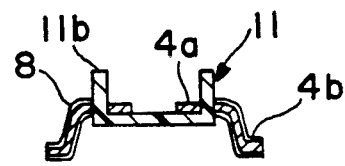
Figure 6F:
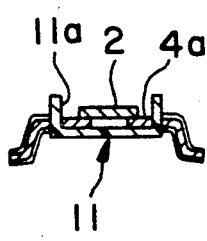
Figure 6G:
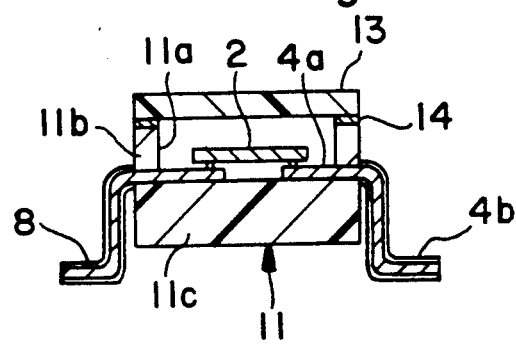
Figure 6H:
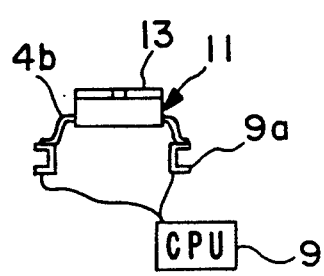
Figure 6I:
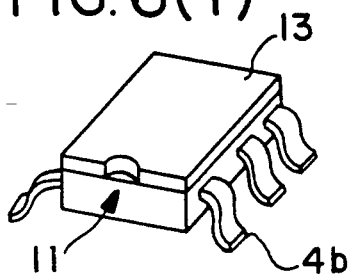

FIG. 5 is a flow chart showing one embodiment of a method for manufacturing semiconductor devices according to the present invention, and FIGS. 6(a) and 6(i) are views which illustrate an embodiment of the manufacturing method according to the present invention.

In these figures, the same reference numerals are used to denote the elements which are the same as or correspond to those explained in connection with FIGS. 1 to 4. A detailed description of these elements is therefore omitted here.

In the preferred embodiment of the present invention, as shown in FIG. 5, a process for manufacturing semiconductor chips and a process for manufacturing resin cases are carried out in parallel. More specifically, a semiconductor wafer is formed into a state which allows a dicing apparatus to break the semiconductor wafer into individual semiconductor chips. Independently of this step, to a case main body are bonded leads each having an inner end (inner lead portion) on the inner side of a side edge of the case main body and an outer end (outer lead portion) on the outer side of the side edge. Then, the inner ends of the leads are electrically connected to the semiconductor chip in the case main body and, subsequently, a lid is adhesively bonded to the case main body, thus completing the manufacturing of a semiconductor device.

The above embodiment of the method for manufacturing semiconductor devices in accordance with the present invention will now be described in more detail with reference to FIGS. 6(a) to 6(i).

First, a plurality of semiconductor chips 2 are formed on a semiconductor wafer 1, and a sheet 3 is adhesively bonded to the back of the semiconductor wafer 1. Then, a dicing apparatus (not shown) is used to form grooves 1a in the side of the semiconductor wafer 1 which is opposite to the sheet 3 for the purpose of separating the wafer 1 into the individual semiconductor chips 2 (FIG. 6(a)).

A leadframe 4 is clamped in a mold 12 and a sealing resin 15 is charged into cavities 12c and 12d (FIG. 6(b)). The mold 12 is constituted by an upper die 12a and a lower die 12b, and the cavities 12c and 12d are formed in the upper and lower dies 12a and 12b, respectively. The cavity 12c is formed as to surround inner leads 4a at three sides thereof and to form a frame portion 11b of the case main body, for example, a case 11 made of a resin. The cavity 12d serves to form a bottom portion 11c of the case 11. The leadframe 4 may be of the hoop type, the type in which ten to fourteen semiconductor-chip carrying portions are formed integrally, or any other type which enables the process steps up to a lead formation step to be carried out continuously. After the sealing resin 15 has been cured, the leadframe 4 is released from the mold 12 and the outer lead 4b of the leadframe 4 is formed. Then, the thus-formed cases 11 together with the respective outer leads 4b are separated from the leadframe 4 as shown in FIG. 6(d). As illustrated, each of the cases 11 is formed integrally with the leadframe 4 by means of the mold 12, and an opening 11a is formed at the top of the case 11 to face the inner leads 4a of the leadframe 4 and hence the bottom portion 11c of the case 11. Incidentally, in the molding process for the case 11, a case-lid molding apparatus (not shown) is used for forming the case 11 and a lid 13 made of, for example, a resin and, in the process for forming the outer leads 4b, a case forming apparatus (not shown) is used. Finally, an outer plating 8 is applied to each outer lead 4b by means of a plating apparatus (not shown) as shown in FIG. 6(e). Thus, the assembly of the case 11 is completed.

As shown in FIG. 6(f), a chip bonding apparatus (not the semiconductor chip 2 to the inner leads 4a under pressure within the opening 11a of the case 11 thus assembled, thereby electrically connecting the semiconductor chip 2 to the inner leads 4a. Then, as shown in FIG. 6(g), the lid 13 is adhesively bonded to the case 11 by means of a lid mounting apparatus (not shown). In this fashion, after the semiconductor chip 2 has been mounted in the case 11, the lid 13 is bonded to the frame portion 11b of the case 11 by an adhesive 14 to airtightly close the opening 11a of the case 11, thereby hermetically sealing the interior of the case 11 including the semiconductor chip 2. Subsequently, as shown in FIG. 6(h), the semiconductor device which has been assembled is connected to a testing apparatus 9 through a connecting member 9a and subjected to a performance test. In this fashion, a semiconductor device such as that shown in FIG. 6(i) is finished.

Accordingly, in accordance with the embodiment described above, the case 11 and the lid 13 can be manufactured before the semiconductor chip 2 is manufactured. Since the only process steps to be executed after the manufacturing of the semiconductor chip 2 are the steps of chip bonding and lid bonding, the total time period required to manufacture each semiconductor device can be reduced.

Figure 7:
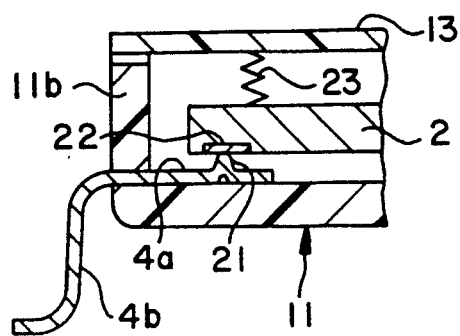
FIG. 7 is a partial cross-sectional view of a semiconductor device fabricated by another embodiment of the method for manufacturing semiconductor devices in accordance with the present invention.

FIG. 7 is a partially cross-sectional view showing a semiconductor device which is assembled by another embodiment of the manufacturing method according to the present invention. In the figure, the same reference numerals are used to denote the elements which are the same as or correspond to those explained in connection with FIGS. 6(a) to 6(i), and a detailed description of these elements is therefore omitted here.

In the illustrated embodiment, a portion of each inner lead 4a is formed into projection 21 which projects toward the semiconductor chip 2, and the projection 21 is maintained in contact with a pad 22 attached to the semiconductor chip 2. The semiconductor chip 2 is pressed by a compression spring 23 to prevent the pad 22 from separating from the projection 21. When the lid 13 is adhesively bonded to the case 11, the compression spring 23 is compressed.

Although the present embodiments are explained with reference to the examples in each of which the semiconductor chip 2 is bonded directly to the inner leads 4a, wire bonding may be implemented by using metallic wires.

What is claimed is:

1. A method for manufacturing a packaged semiconductor device comprising sequentially:
   integrally molding an electrically insulating resin case including side walls and a bottom wall with a lead frame including a plurality of leads, each lead having an inner end disposed within the resin case proximate the bottom wall and an outer end disposed outside the resin case;

placing a semiconductor chip including a plurality of electrodes within the resin case with the electrodes in electrical and mechanical contact with respective inner leads; and bonding a resin lid to the side walls to close the resin case with the semiconductor chip therein.

2. The method of claim 1 including, after placing the semiconductor chip within the resin case, applying pressure to the semiconductor chip in the direction of the bottom wall to bond the electrodes to the respective inner leads.

3. The method of claim 1 wherein the inner ends include projections including placing the semiconductor chip in the resin case with the electrodes in registration and electrical and mechanical contact with respective projections.

4. The method of claim 3 including, before bonding the resin lid to the resin case, placing a spring on the semiconductor chip within the resin case and placing the resin lid on the resin case compressing the spring, thereby urging the electrodes into contact with the respective projections, and thereafter bonding the resin lid to the side walls.

5. The method of claim 1 including integrally molding the resin case and the lead frame with the leads penetrating the side walls of the resin case.

* * * * *